US011676007B2

(12) United States Patent
Lovell et al.

(10) Patent No.: US 11,676,007 B2
(45) Date of Patent: Jun. 13, 2023

(54) DEFECT REMOVAL FROM MANUFACTURED OBJECTS HAVING MORPHED SURFACES

(71) Applicant: Autodesk, Inc., San Francisco, CA (US)

(72) Inventors: David Patrick Lovell, Moseley (GB); Daniela Sofia Seixas Sousa, Stafford (GB); Chin-Yi Cheng, San Francisco, CA (US)

(73) Assignee: Autodesk, Inc., San Francisco, CA (US)

( * ) Notice: Subject to any disclaimer, the term of this patent is extended or adjusted under 35 U.S.C. 154(b) by 793 days.

(21) Appl. No.: 16/524,912

(22) Filed: Jul. 29, 2019

(65) Prior Publication Data

US 2021/0034961 A1    Feb. 4, 2021

(51) Int. Cl.
  *G06N 3/08*    (2023.01)
  *G05B 19/4097*    (2006.01)
  *G06F 30/20*    (2020.01)

(52) U.S. Cl.
  CPC ........... *G06N 3/08* (2013.01); *G05B 19/4097* (2013.01); *G06F 30/20* (2020.01); *G05B 2219/35134* (2013.01)

(58) Field of Classification Search
  CPC ...... G06N 3/08; G06F 30/20; G05B 19/4097; G05B 2219/35134
  USPC .......................................................... 703/25
  See application file for complete search history.

(56) References Cited

U.S. PATENT DOCUMENTS

| 5,220,441 A | * | 6/1993 | Gerstenberger | ........ G06T 7/593 348/42 |
| 2007/0003117 A1 | * | 1/2007 | Wheeler | ............... G06T 7/0012 382/128 |
| 2019/0236759 A1 | * | 8/2019 | Lai | ......................... G06V 10/82 |

OTHER PUBLICATIONS

Dandong_2018 (Rough Machining for Metal Casting, Jan. 27, 2018). (Year: 2018).*

(Continued)

*Primary Examiner* — Brian S Cook
(74) *Attorney, Agent, or Firm* — Fish & Richardson P.C.

(57) ABSTRACT

Methods, systems, and apparatus, including medium-encoded computer program products, for computer aided repair of physical structures include: generating a two dimensional difference image from a first three dimensional model of at least one actual three dimensional surface of a manufactured object, and a second three dimensional model of at least one source three dimensional surface used as input to a manufacturing process that generated the manufactured object; obtaining from an image-to-image translation based machine learning algorithm, trained using pairs of input images representing deformed and deformed plus surface defected added versions of a nominal three dimensional surface, a translated version of the two dimensional image; generating from the translated version of the two dimensional image a third three dimensional model of at least one morphed three dimensional surface corresponding to the at least one source three dimensional surface. Further, defects can be removed based on the third three dimensional model.

22 Claims, 9 Drawing Sheets

(56) References Cited

OTHER PUBLICATIONS

Stavropoulos_2018 (Addressing the challenges for the industrial application of additive manufacturing: Towards a hybrid solution, International Journal of Lightweight Materials and Manufacture, 2018). (Year: 2018).*
Isola_2018 (Image-to-image Translation with Conditional Adversarial Networks, Nov. 26, 2018) (Year: 2018).*
Crary_2018 (Evaluating the Accuracy of a 3D Printed Part Against the CAD Model, Aug. 20, 2018 downloaded from gomeasure3d.com/blog) (Year: 2018).*
Goodfellow_2014 (Generative Adversarial Nets) (Year: 2014).*
Generative Adversarial Network Wikipedia Archive (Year: 2019).*
Floater and Hermann, "Surface Parameterization: a Tutorial and Survey," (2005) In: Dodgson N.A., Floater M.S., Sabin M.A. (eds) Advances in Multiresolution for Geometric Modelling, Mathematics and Visualization, Springer, Berlin, Heidelberg, pp. 1-30.
Hesse, "Image-to-Image Translation in Tensorflow," (Jan. 25, 2017) [online] (retrieved from https://affinelayer.com/pix2pix/). 9 pages.
Hesse et al., "Tensorflow Port of Image-to-Image Translation with Conditional Adversarial Nets," (Apr. 15, 2019) [online] (retrieved from https://github.com/affinelayer/pix2pix-tensorflow), 8 pages.
Isola et al., "Image-to-Image Translation with Conditional Adversarial Networks," (Nov. 26, 2018) [online] (retrieved from https://arxiv.org/abs/1611.07004.pdf), 17 pages.
Odena et al., "Deconvolution and Checkerboard Artifacts," (Oct. 17, 2016) [online] (retrieved from http://doi.org/10.23915/distill.00003), 9 pages.

* cited by examiner

DEFECT REMOVAL FROM MANUFACTURED OBJECTS HAVING MORPHED SURFACES

BACKGROUND

This specification relates to defect removal from manufactured objects which can be manufactured using additive manufacturing, subtractive manufacturing and/or other manufacturing systems and techniques.

Computer Aided Manufacturing (CAM) software has been developed and used to manufacture the physical structures of those objects, e.g., using Computer Numerical Control (CNC) manufacturing techniques. The manufactured objects may have one or more morphed surfaces that deviate slightly from the ideal surfaces of the objections, as designed. Additionally, the manufactured objects may have one or more defects on the surface either due to manufacturing imperfection, support structures used during manufacturing, or due to later usage after manufacturing. The defects on the surfaces of the manufactured objects may need to be removed.

Existing smoothing methods for a manufactured object often involve scanning an object, getting a mesh of the object and performing operations to the measured mesh. Existing mesh smoothing tools aim to remove random noise by detecting the three-dimensional (3D) lumps or bumps in the measured 3D mesh, through operations such as a Gaussian detection. Customized defect removal solutions also exist, which involve a part-variant-specific process of scanning an object, getting a mesh of the object and comparing the measured mesh with the nominal Computer Aided Design (CAD) surface model in 3D, where the part-variant-specific process is informed by specific knowledge of the manufacturing process for the particular part.

SUMMARY

This specification relates to defect removal from manufactured objects which can be manufactured using additive manufacturing, subtractive manufacturing and/or other manufacturing systems and techniques.

In general, one or more aspects of the subject matter described in this specification can be embodied in one or more methods (and also one or more non-transitory computer-readable mediums tangibly encoding a computer program operable to cause data processing apparatus to perform operations) including: obtaining, in a computer aided manufacturing program, a first three dimensional model of at least one actual three dimensional surface of a manufactured object, and a second three dimensional model of at least one source three dimensional surface used as input to a manufacturing process that generated the manufactured object; producing, by the computer aided manufacturing program, a two dimensional image by projection of points between the first three dimensional model and the second three dimensional model, wherein each of multiple pixel values in the two dimensional image is a difference along a projection from a point in the second three dimensional model to a corresponding point in the first three dimensional model; providing, by the computer aided manufacturing program, the two dimensional image to an image-to-image translation based machine learning algorithm, wherein the image-to-image translation based machine learning algorithm was previously trained using pairs of input images, each of the pairs of input images being a first image representing differences between a nominal three dimensional surface and a corresponding morphed version of the nominal three dimensional surface, and a second image representing differences between the nominal three dimensional surface and a corresponding morphed version of the nominal three dimensional surface with one or more included surface defects; receiving, by the computer aided manufacturing program, a translated version of the two dimensional image from the image-to-image translation based machine learning algorithm; and producing, by the computer aided manufacturing program, a third three dimensional model of at least one morphed three dimensional surface corresponding to the at least one source three dimensional surface by projection of points between the first three dimensional model and the second three dimensional model using differences represented by pixel values in the translated version of the two dimensional image.

The two dimensional image can be a greyscale image with sixteen-bit bit depth. The image-to-image translation based machine learning algorithm can employ (a) at least a first neural network portion that learns to generate mask images from training images, and (b) at least a second neural network portion that learns to remove defects from the training images within areas specified by the mask images. The image-to-image translation based machine learning algorithm can employ (a) Conditional Generative Adversarial Networks to learn a mapping from input image to output image and (b) a loss function to train the mapping.

The Conditional Generative Adversarial Networks can be modified to remove high frequency noise in the output image, wherein the modified Conditional Generative Adversarial Networks includes: one or more of the deconvolution layers in the neural network including: a resize layer which resizes the input data to the modified devolution layer; and a convolution layer which takes the output of the resize layer as input, and performs convolution operations.

The method (or operations performed by the data processing apparatus in accordance with the computer program tangibly encoded in one or more non-transitory computer-readable mediums) can include training the image-to-image translation based machine learning algorithm. Training the image-to-image translation based machine learning algorithm can include: generating the pairs of input images by automatically producing multiple random deformations in, and adding multiple random surface defects to, at least one three dimensional surface model; and providing the pairs of input images to the image-to-image translation based machine learning algorithm to process.

The manufacturing process that generated the manufactured object can include casting, and the method (or operations performed by the data processing apparatus in accordance with the computer program tangibly encoded in one or more non-transitory computer-readable mediums) can include removing at least one casting defect from the manufactured object by milling the manufactured object in accordance with the third three dimensional model of the at least one morphed three dimensional surface. The manufacturing process that generated the manufactured object can include additive manufacturing, and the method (or operations performed by the data processing apparatus in accordance with the computer program tangibly encoded in one or more non-transitory computer-readable mediums) can include removing at least one support structure remnant from the manufactured object by milling the manufactured object in accordance with the third three dimensional model of the at least one morphed three dimensional surface.

One or more aspects of the subject matter described in this specification can also be embodied in one or more systems including: a non-transitory storage medium having instructions of a computer aided manufacturing program stored thereon; and one or more data processing apparatus able to run the instructions of the computer aided manufacturing program to perform operations specified by the instructions of the computer aided manufacturing program; wherein the instructions of the computer aided manufacturing program include means for generating a two dimensional difference image from a first three dimensional model of at least one actual three dimensional surface of a manufactured object, and a second three dimensional model of at least one source three dimensional surface used as input to a manufacturing process that generated the manufactured object, means for obtaining from an image-to-image translation based machine learning algorithm, trained using pairs of input images representing deformed and deformed plus surface defected added versions of a nominal three dimensional surface, a translated version of the two dimensional image, and means for generating from the translated version of the two dimensional image a third three dimensional model of at least one morphed three dimensional surface corresponding to the at least one source three dimensional surface.

The two dimensional image can be a greyscale image with sixteen-bit bit depth. The means for obtaining can include means for employing (a) at least a first neural network portion that learns to generate mask images from training images, and (b) at least a second neural network portion that learns to remove defects from the training images within areas specified by the mask images. The means for obtaining can include means for employing (a) Conditional Generative Adversarial Networks to learn a mapping from input image to output image and (b) a loss function to train the mapping.

The Conditional Generative Adversarial Networks can be modified to remove high frequency noise in the output image, wherein the modified Conditional Generative Adversarial Networks includes: one or more of the deconvolution layers in the neural network including: a resize layer which resizes the input data to the modified devolution layer; and a convolution layer which takes the output of the resize layer as input, and performs convolution operations. The means for obtaining can include means for training the image-to-image translation based machine learning algorithm using automatically produced image pairs. Moreover, the system can include means for removing at least one defect from the manufactured object.

Particular embodiments of the subject matter described in this specification can be implemented to realize one or more of the following advantages. Defects on the surfaces of manufactured objects can be detected by machine learning algorithm(s) that operate in a two-dimensional (2D) space, and these defects can be readily distinguished from deformations of the objects that are a natural result of the manufacturing process(es) used. The nominal surface of an object (from the original design) can be accounted for, and the defects can be successfully removed without excess removal of other material that does not constitute a defect, even though that material does not exactly match the nominal surface of the source design for the object. Note that "defect", as used herein, includes both unintended material added by the manufacturing process (e.g., an extra lump of metal on a part after a casting of the part) and intended material (e.g., a portion of support material from 3D printing of a part that is not fully removed). Defect removal can be achieved more efficiently, without requiring a time consuming process of customizing defect removal for each part variant. The machine learning algorithm(s) can be rapidly trained to identify defects, as being distinct from general part morphing during manufacturing, e.g., general warping of a casting of the part, without requiring sophisticated knowledge of the particular manufacturing process. Thus, the costs associated with defect removal processes can be substantially reduced, and defect removal can be readily scaled to many part variants, enabling mass market application.

The details of one or more embodiments of the subject matter described in this specification are set forth in the accompanying drawings and the description below. Other features, aspects, and advantages of the invention will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
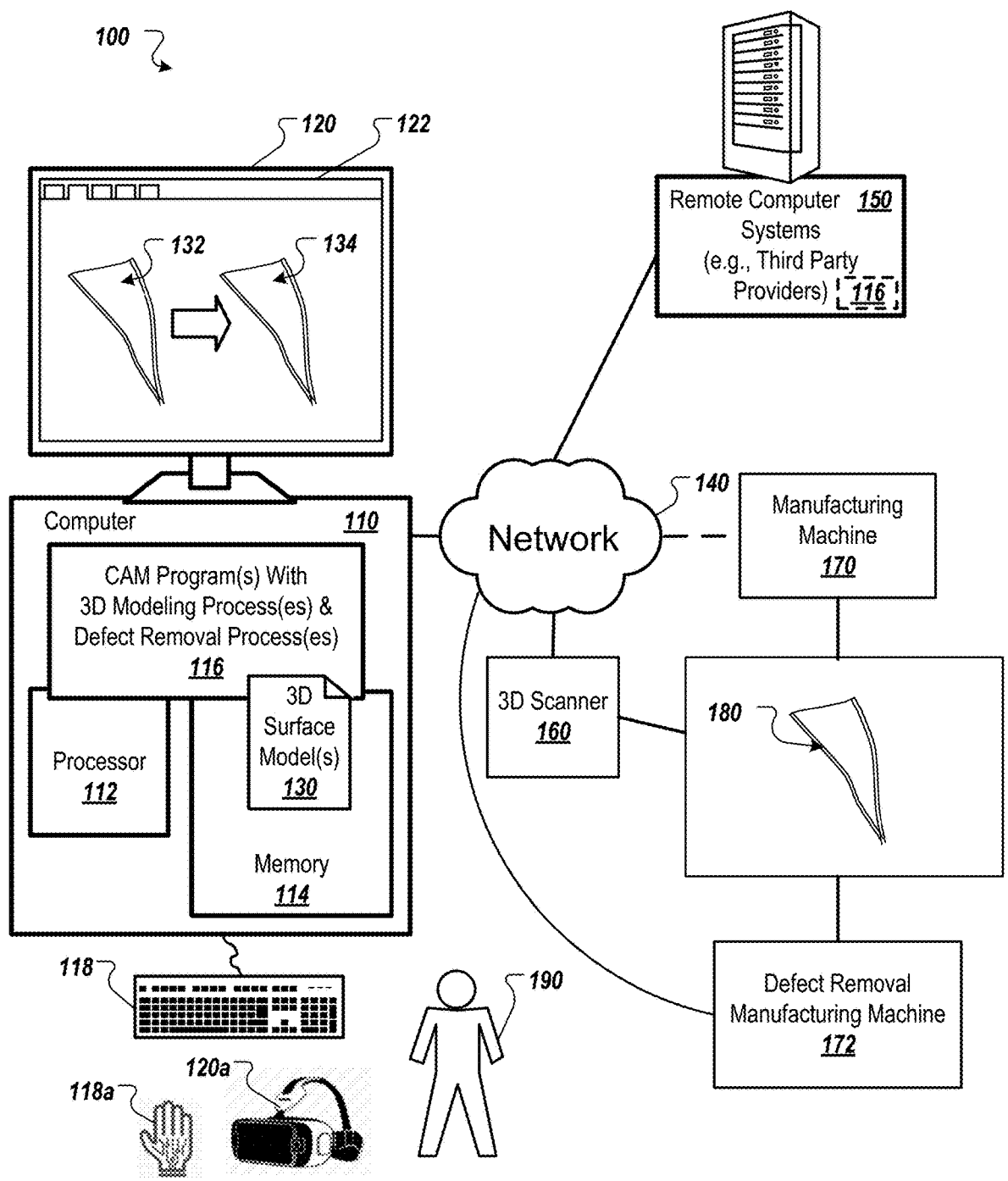
FIG. 1 shows an example of a system usable to remove defects from manufactured objects having morphed surfaces.

FIG. 1 shows an example of a system 100 usable to remove defects from manufactured objects having morphed surfaces. A computer 110 includes a processor 112 and a memory 114, and the computer 110 can be connected to a network 140, which can be a private network, a public network, a virtual private network, etc. The processor 112 can be one or more hardware processors, which can each include multiple processor cores. The memory 114 can include both volatile and non-volatile memory, such as Random Access Memory (RAM) and Flash RAM. The computer 110 can include various types of computer storage media and devices, which can include the memory 114, to store instructions of programs that run on the processor 112, including Computer Aided Manufacturing (CAM) program(s) 116, which implement three-dimensional (3D) surface modeling and surface defects removal processes.

A manufacturing machine 170 manufactures an object 180 (e.g., a turbine blade or blisk) according to a nominal surface of a CAD model. In some implementations, the manufacturing machine 170 is an additive manufacturing (AM) machine that builds the physical structure 180 directly. For example, the manufacturing machine 170 can be a 3D printer that deposit one or more metals to build the manufactured object 180. In some implementations, the manufacturing machine 170 is a casting machine that uses a mold to perform part casting. The casting can be either cold casting or hot casting.

A manufactured object 180 is manufactured according to a nominal surface of a CAD model by the manufacturing machine 170. The manufactured object 180 usually does not match the nominal surface of the CAD model exactly, as the object will exhibit some amount of deformation or warping (referred to generally as "morphing" herein) as a result of the manufacturing process. In addition, the manufactured object 180 may have surface defects that need to be removed.

A 3D scanner 160 scans the manufactured object 180 to generate a mesh representation of the manufactured object, and the CAM program(s) 116 can use this input mesh to generate (and/or directly as) one or more 3D surface models 132 of the manufactured object 180. The CAM program(s) 116 can use the systems and techniques described herein to generate one or more modified 3D surface models 134, which are useable to remove any defects on the manufactured object 180 without also removing morphed portions of the object 180 that do not exactly match the original CAD model, but also do not impact the part's performance during use.

As used herein, CAM program(s) 116 refers to any suitable program used to generate 3D surface models useable to remove defects on physical objects, often referred to as adaptive repair software or adjusting machining, regardless of whether or not the program is capable of interacting with and/or controlling specific manufacturing equipment or designing parts initially. Thus, CAM program(s) 116 can include Computer Aided Engineering (CAE) program(s), Computer Aided Design (CAD) program(s), etc. The CAM program(s) 116 can run locally on computer 110, remotely on a computer of one or more remote computer systems 150 (e.g., one or more third party providers' one or more server systems accessible by the computer 110 via the network 140) or both locally and remotely. Thus, a CAM program 116 can be two or more programs that operate cooperatively on two or more separate computer processors in that a program 116 operating locally at computer 110 can offload processing operations (e.g., mesh conversion and/or calculation of the 3D surface models 134 to remove the defects) "to the cloud" by having one or more programs 116 on one or more computers 150 perform the offloaded processing operations.

The CAM program(s) 116 present a user interface (UI) 122 on a display device 120 of the computer 110, which can be operated using one or more input devices 118 of the computer 110 (e.g., keyboard and mouse). Note that while shown as separate devices in FIG. 1, the display device 120 and/or input devices 118 can also be integrated with each other and/or with the computer 110, such as in a tablet computer (e.g., a touch screen can be an input/output device 118, 120). Moreover, the computer 110 can include or be part of a virtual reality (VR) or augmented reality (AR) system. For example, the input/output devices 118, 120 can include a VR/AR input glove 118a and/or a VR/AR headset 120a.

In addition, in some implementations, the CAM program(s) 116 implement manufacturing control functions. The 3D model 134 can be stored as the 3D model document(s) 130 and/or used to generate another representation of the model (e.g., a .STL file for additive manufacturing). This can be done upon request by a user 190, or in light of the user's request for another action, such as sending the 3D model 134 to a defect removal manufacturing machine 172, which can be directly connected to the computer 110, or connected via a network 140, as shown. This can involve a post-process carried out on the local computer 110 or a cloud service to export the 3D model 134 to an electronic document usable to remove the defects on the manufactured object. Note that an electronic document (which for brevity will simply be referred to as a document) can be a file, but does not necessarily correspond to a file. A document may be stored in a portion of a file that holds other documents, in a single file dedicated to the document in question, or in multiple coordinated files.

In some implementations, the defect removal manufacturing machine 172 is a subtractive manufacturing (SM) machine (e.g., a Computer Numerical Control (CNC) milling machine, such as a multi-axis, multi-tool milling machine) that is controlled by the CAM program(s) 116 to perform the defect removal process. For example, the CAM program(s) 116 can generate CNC instructions for a machine tool system that includes multiple tools (e.g., solid carbide round tools of different sizes and shapes, and insert tools of different sizes that receive metal inserts to create different cutting surfaces) useable for various machining operations. Thus, in some implementations, the CAM program(s) 116 can provide a corresponding document (having toolpath specifications of an appropriate format, e.g., a CNC numerical control (NC) program) to the SM machine for use in removing the defect in the manufactured object 180 using various cutting tools, etc.

In some implementations, the defect removal manufacturing machine 172 is the manufacturing machine 170. Thus, the manufacturing machine 170 can be used to both build the part initially and then be used to remove any defects. There is no need to have an additional defect removal manufacturing machine 172 in such implementations, but separate machines are still possible (e.g., a first CNC milling tool 170 to build the part at one point in a manufacturing line, and a second CNC milling tool 172 to remove any defects in at a later point in the manufacturing line). Moreover, as noted above, the machine 170 can be an AM machine, and the CAM program(s) 116 can, in some implementations, control both the AM machine 170 and the SM machine 172 using toolpath specifications generated in appropriate formats for the respective machines.

Figure 2A:
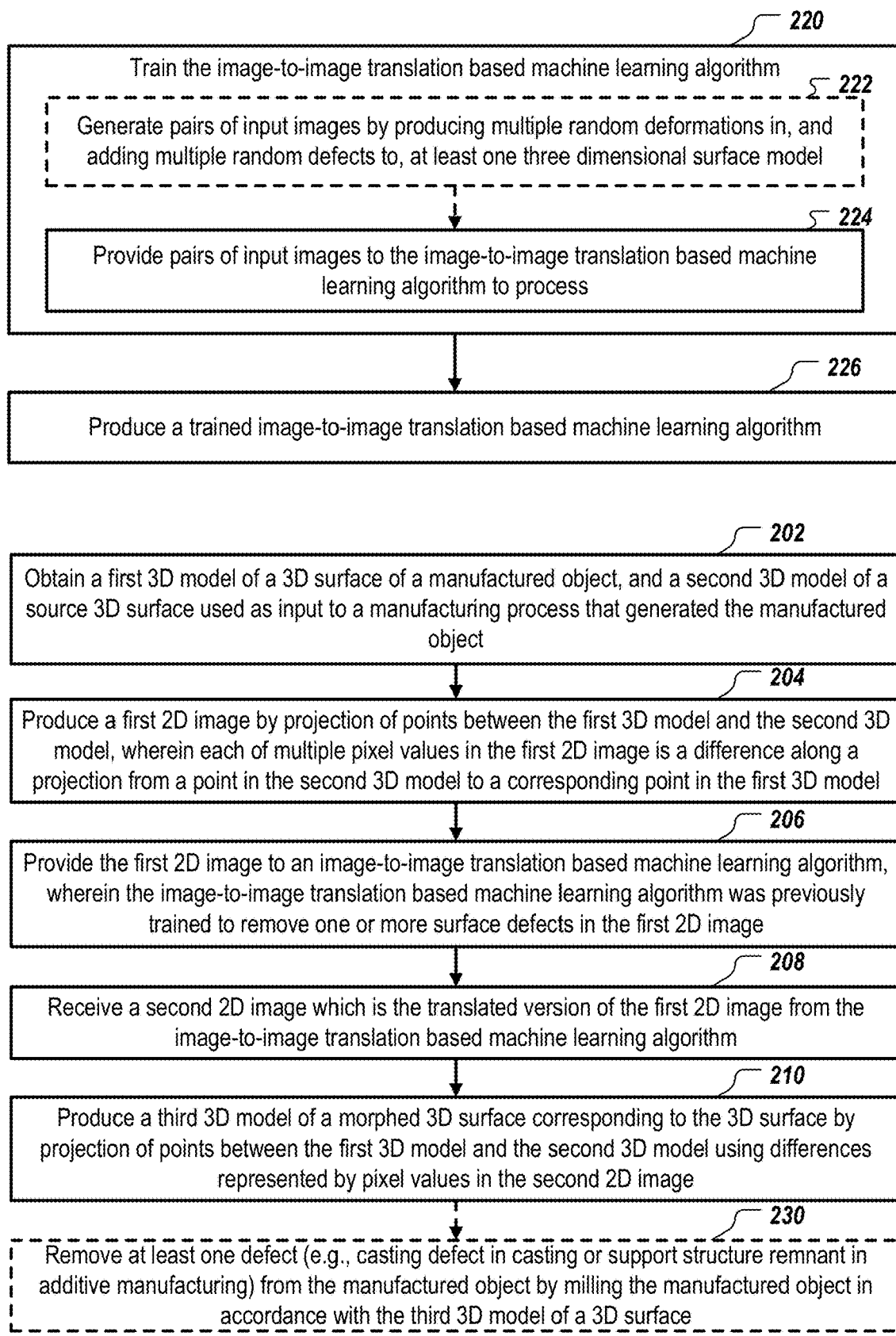
FIG. 2A is a flowchart showing an example of a process to remove defects from manufactured objects having morphed surfaces, as well as an initial training process for a machine learning algorithm used in this process.

FIG. 2A shows an example of a process to remove defects from manufactured objects having morphed surfaces using a machine learning algorithm. Two 3D surface models are obtained 202, e.g., by the CAM program(s) 116. This can include a first 3D model being received or being produced, and a second 3D model being received or being produced. The first 3D model includes at least one actual 3D surface of a manufactured object. For example, the 3D scanner 160 scans the manufactured object 180 and produces a mesh representation of the manufacture object 180; the mesh representation is sent from the 3D scanner 160 to the computer 110 through the network 140; and the CAM program(s) 116 receive the mesh representation, which is the first 3D model that includes at least one actual 3D surface of a manufactured object 180.

The second 3D model includes at least one source 3D surface used as input to a manufacturing machine that generated the manufactured object. For example, the CAM program(s) 116 can receive or produce the original 3D CAD model of the object 180 used to manufacture the object 180. The source 3D surface can be a saved mesh model, or a boundary representation format (e.g., B-Rep) model, from which the object 180 was manufactured. In some implementations, the second 3D model is obtained by loading a previously saved mesh representation. In some implementations, the second 3D model is obtained by producing a mesh model from a B-rep model that was created earlier.

For example, the first 3D model can be a polygon mesh model obtained from the mesh representation of the manufactured object generated from the 3D scanner 160, and the second 3D model can be a polygon mesh model produced from the B-Rep surface in the source CAD model. The polygon mesh in both models can be a triangle mesh, either originally or by conversion thereto. Various types of mesh formats can be used as input, including tetrahedral or hexahedral meshes.

As another example, an aerofoil has two sides with two separate B-reps representing a concave surface and a convex surface. In this application, two 3D surface models can be generated separately and defect removal processing steps can be applied separately to each of the two surfaces.

A first two-dimensional (2D) image is produced 204, e.g., by the CAM program(s) 116, by projection of points between the first 3D model and the second 3D model, wherein each of multiple pixel values in the first 2D image is a difference along a projection from a point in the second 3D model to a corresponding point in the first 3D model. The first 2D image is an error map, wherein each of the pixel values in the first 2D image is a difference along a projection from a point in a nominal surface (i.e., the second 3D model) to a measured surface (i.e., the first 3D model). In other words, each pixel represents an error between the value of the nominal surface and the value of the measured surface.

For example, the first 2D image can be calculated using the following steps: (1) extract from the nominal surface 256 points on the longitudinal direction and 256 points on the lateral direction; (2) get the surface normal vector for each point on the nominal surface; (3) for each point, project a ray against the measured mesh according to the surface normal vector direction; (4) for each point on the nominal surface, calculate its distance to the point where the ray intersects with the measured mesh; and (5) scale the distance values in accordance with the range of digital values available in the image format being used. These steps produce a 256 by 256 matrix of surface deviation values. Note that the distance values can be positive or negative, but the image format may only allow positive values. Thus, the scaling in step 5 should take this into account. Moreover, in addition to different bit depths for the image format, different size images (other than 256 by 256) can also be used.

The first 2D image is provided 206, e.g., by the CAM program(s) 116, to an image-to-image translation based machine learning algorithm. The image-to-image translation based machine learning algorithm was previously trained using pairs of input images. Each of the pairs of input images are a pair of 2D images. One 2D image in the pair of the input images represents differences between a nominal 3D surface and a corresponding deformed version of the nominal 3D surface. The other 2D image in the pair of the input images represents differences between the nominal 3D surface and a corresponding deformed version of the nominal 3D surface with one or more included surface defects.

In general, a machine learning algorithm builds a mathematical model based on training data. The image-to-image translation based machine learning algorithm to which the first 2D image is provided 206 has been trained to remove one or more surface defects by translation of a first 2D image with one or more defects to a second 2D image that is exactly the same as the first 2D image only with the defects removed. For example, the image-to-image translation based machine learning algorithm can be trained to translate a low frequency doubly curved surface with defects (e.g., representing a cast aerofoil) to a low frequency doubly curved surface without defects (e.g., representing a repaired aerofoil).

The input pairs of training images can be either real images calculated from manufactured objects, or synthetic images with defects that are representative of defects in the manufactured objects, or a combination of both. Generating synthetic pairs of input images is described in further detail in connection with FIG. 7.

Training the image-to-image translation based machine learning algorithm can be done at various times. For example, the machine learning algorithm can be fully trained (e.g., by a third party) before the algorithm is used to generate the translated version of an input image. As another example, the machine learning algorithm can be partially trained initially and then be trained on an ongoing basis while defects are being corrected (manually and/or automatically). Thus, pairs of training images can be generated on an ongoing basis for additional training to improve the machine learning algorithm as it is used in practice.

Training the image-to-image translation based machine learning algorithm can be done at various places. In some implementations, remote computer systems 150 perform the training with the advantage of having larger memory storage and better computation resources. In some implementations, the CAM program(s) 116 perform the training. In some implementations, data from multiple organizations can be used to continually train a shared machine learning algorithm that is used by those separate organizations in their respective production environments.

Training 220 and producing 226 a trained image-to-image translation based machine learning algorithm is shown in FIG. 2. The training 220, involves providing 224 pairs of input images to the image-to-image translation based machine learning algorithm to process. Optionally, before 224, the training 220, involves generating 222 pairs of input images by producing multiple random deformations in, and adding multiple random surface defects to, at least one three dimensional surface model. The random deformation and random surface defects are within a range such that the resulting surface represents a realistic manufactured object. The automatic random deformation and random surface defect additions can quickly generate a large amount of training image pairs, which is useful for training a machine learning algorithm. A trained image-to-image translation based machine learning algorithm is produced 226 after the training 220.

Training a machine learning algorithm may require large memory and specialized high performance processors, including processors with graphical processing units (GPUs). The training 220, e.g., by CAM program(s) 116, can run locally on computer 110, remotely on a computer of one or more remote computer systems 150 (e.g., one or more computer systems with large memory and one or more GPUs accessible by the computer 110 via the network 140) or both locally and remotely. Thus, the training 220 can offload processing operations (e.g., generating multiple random deformations, adding multiple random surface defects, forward and backward propagation calculations, gradient descent calculations, etc.) "to the cloud" by having one or more operations 222 and/or 224 run on one or more computers 150.

The trained image-to-image translation based machine learning algorithm performs the following steps: (1) taking as input, a difference image that represents differences between a nominal 3D surface and a deformed version of the nominal 3D surface with defects; and (2) generating as output, another difference image that represents differences between the nominal 3D surface and a deformed version of the nominal 3D surface without defects. The output of the machine learning algorithm is a 2D image that represents an error map, wherein each of the pixel values in the 2D image represents a difference along a projection from a point in a nominal surface to a deformed surface without defects.

A second 2D image is received 208, e.g., by the CAM program(s) 116. The second 2D image is a translated version of the first 2D image from the image-to-image translation based machine learning algorithm. The second 2D image represents an error map, wherein each of the pixel values in the second 2D image represents a difference along a projection from a point in a nominal surface (i.e., the second 3D model) to a measured surface (i.e. the first 3D model) with defects removed and/or significantly reduced.

A third 3D model is produced 210, e.g., by the CAM program(s) 116. The third 3D model includes at least one morphed 3D surface with defects removed. The third 3D model includes at least one morphed 3D surface corresponding to the at least one source 3D surface by projection of points between the first 3D model and the second 3D model using differences represented by pixel values in the second 2D image, which is the translated version of the first 2D image.

For example, the third 3D model can be calculated using these steps: (1) map the second 2D image's deviation values to distance values in accordance with the range of digital values available in the image format being used; (2) obtain a 256 times 256 matrix with the distance values; (3) obtain the projection points and their normal vectors previously calculated when producing 204 the first 2D image; and (4) for each point on the nominal surface, add the distance according to the normal vector direction and create the repaired 3D mesh.

Figure 2B:
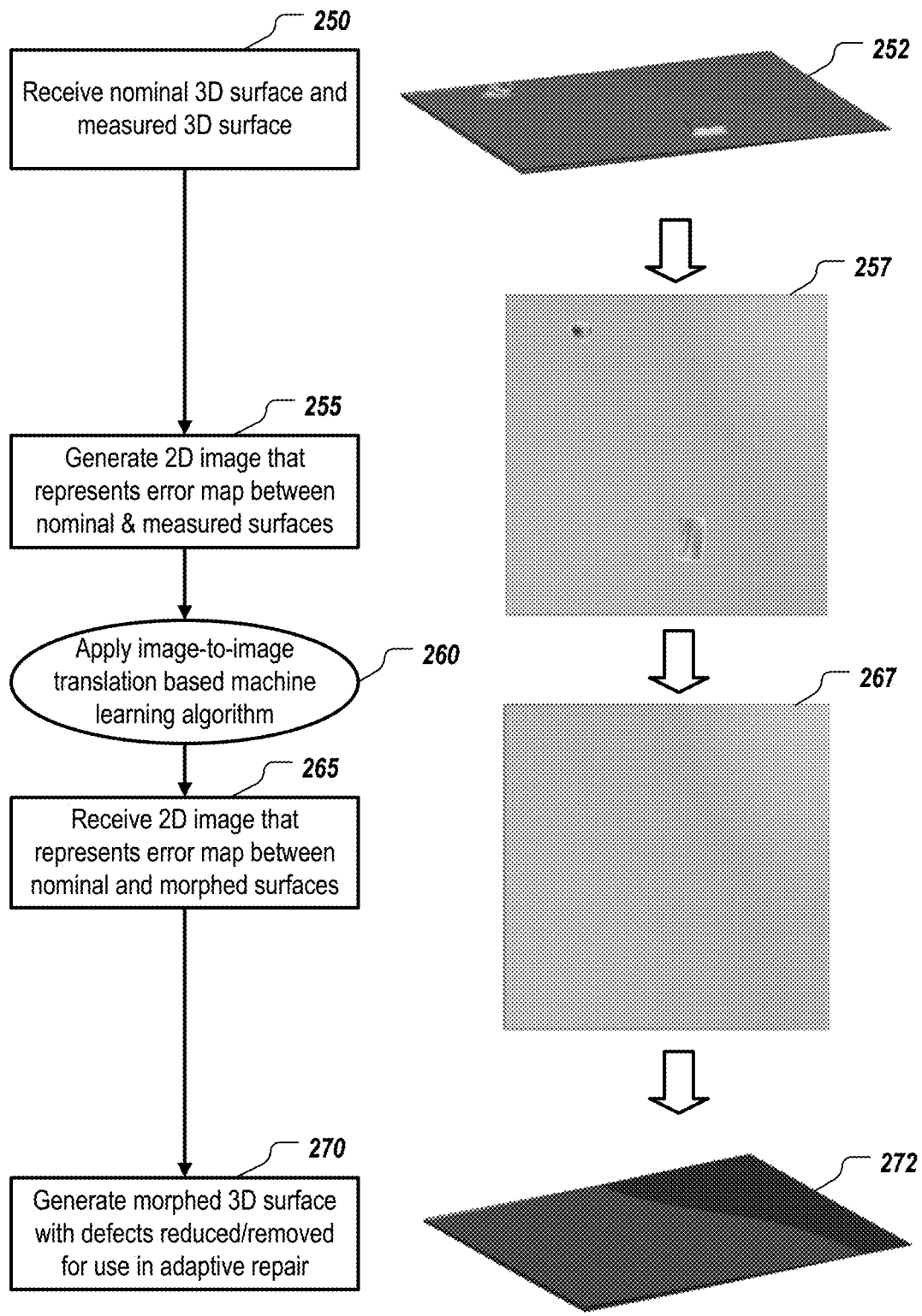
FIG. 2B shows an example of the defect removal process of FIG. 2A applied to a manufactured object having a morphed surface.

FIG. 2B shows an example of the defect removal process of FIG. 2A applied to a manufactured object having a morphed surface. A measured 3D surface and a nominal 3D surface are received 250 by the CAM program(s). The measured mesh 252 has a morphed surface with several 3D bumps on it representing the defects. A 2D image 257 is generated 255 that represents an error map between the nominal 3D surface and the measured 3D surface. The 2D image is provided to an image-to-image translation based machine learning algorithm 260, which was previously trained to remove defects in 2D images. A translated 2D image 267 is produced by and then received 265 from the machine learning algorithm. The translated 2D image 267 represents an error map between the nominal 3D surface and a morphed 3D surface with the defects significantly reduced. Finally, a morphed 3D surface 272 is generated 270 using the error map represented in the translated 2D image 267. The 3D bumps on the morphed 3D surface 248 has been significantly reduced in accordance with the translated 2D image 267. The morphed 3D surface 272 is ready for use in generating CNC toolpath specification(s) for machining the 3D bumps off the object.

An advantage of the techniques described is its ability to differentiate between features that are different from the original design (e.g., natural warping resulting from manufacturing) and unintended defects. The series of processing steps 202-210 take into consideration the nominal surface when smoothing the mesh. By projecting the points in the nominal surface to the measured mesh, the 2D difference image produced represents the deviation both due to deformation and defects (e.g., small sudden bumps). By projecting the output 2D different image back to 3D, a 3D surface model that matches the measured mesh is produced with the defects removed.

Translating a 3D problem to 2D problem simplifies the problem by reducing the amount of information involved in the processing. The techniques described in steps 202-210 convert 3D surface model into a 2D image, fix the defects in the 2D image, and then convert the 2D image back to 3D surface model. The image-to-image translation based machine learning algorithm is trained to preserve the deformation and only remove the defects in the input 2D difference image. The output 2D image from the machine learning model represents the deviation with deformation but without defects.

In some cases, the third 3D surface model produced 210, e.g., by the CAM program(s) 116, has outlines near the edges of the defects. For example, in turbine blade manufacturing, the third 3D surface model, in which the majority of the defects are removed, may still have outlines that surround the defects. In order to remove the remaining outlines, the defect removal techniques described in FIG. 2A can be applied more than once or even multiple times. For example, the 2D image received 208 as output from the image-to-image translation based machine learning algorithm can provided 206 as input to the image-to-image translation based machine learning algorithm for further processing to remove defects, and this looping back of output to input can be repeated until the defects on the surface reach more acceptable tolerances. In this iterative method, the defects on the surface can be gradually removed to a tolerable level, as defined by a threshold set for a given application.

With the third 3D surface model finally ready for use, the defect(s) can be removed 230, e.g., by CAD program(s) 116. Note that the system and program that removes the defect(s) need not be, but can be, the same system and program that generates the morphed model of the surface (with defect(s) removed) useable to control the removal operation(s). In some implementations, when the manufacturing process that generated the manufactured object is casting, at least one casting defect is removed 230, e.g., by defect removal manufacturing machine 172, from the manufactured object by milling the manufactured object in accordance with the third 3D model of the at least one morphed 3D surface.

For example, when a manufactured aerofoil blade has defects, it may be desirable to produce a smooth aerofoil by removing the bumps. In other words, it is desirable to remove the defects of the measured aerofoil, without shaping the measured aerofoil to the nominal shape. The third 3D surface model generated 210 by the systems and techniques described in FIG. 2A can be used to preserve the deformations in the measured aerofoil while the defect(s) are removed.

Note that the toolpath creation for the CNC machine to remove the defects, as described in connection with FIG. 2A, need not require expertise to create the toolpath with CAM software, such as PowerMill. By using the third 3D surface model produced 210, the toolpath can just match the curves in the surface to remove the defects 230. Due to the fact that the curves are aligned with a 3D surface of the manufactured object, except without the defects, the defects can be removed from the manufactured object. Moreover, it is not required that the techniques described in connection with FIG. 2A also create toolpath(s) for CNC machine(s) to remove the defect(s).

In some implementations, when the manufacturing process that generated the manufactured object is additive manufacturing, at least one support remnant is removed 230, e.g., by defect removal manufacturing machine 172, from the manufactured object by milling the manufactured object in accordance with the third 3D model of the at least one morphed 3D surface. For example, a support structure (or remnant thereof) can be removed from a manufactured object. The resulting manufactured object can have a smooth morphed surface without defects, while preserving the deformation in the original manufactured object.

Figure 3:
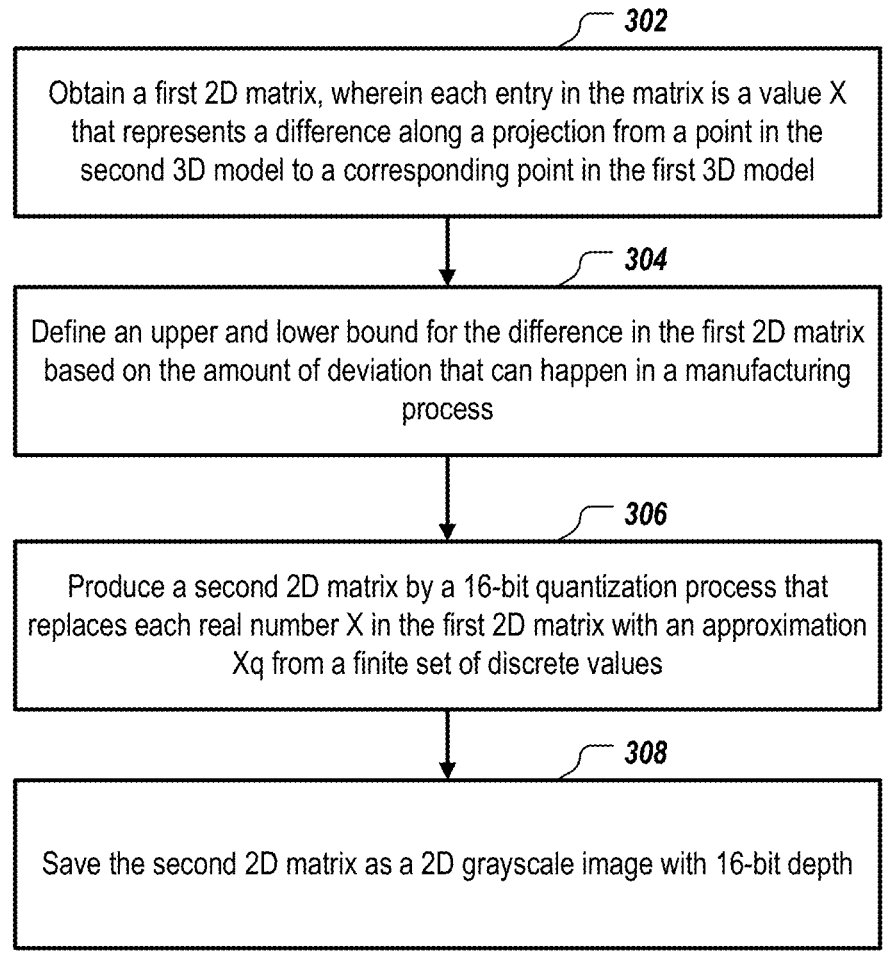
FIG. 3 is a flowchart showing an example of a process to generate a two dimensional grayscale image with sixteen bits.

FIG. 3 shows an example of a process that generates a first 2D grayscale image with sixteen-bit (16-bit) bit depth (e.g., an example of producing a first 2D image 204 in FIG. 2A). A first 2D matrix is obtained 302, e.g., by the CAM program(s) 116, wherein each entry in the matrix is a value X that represents a difference along a projection from a point in the second 3D model to a corresponding point in the first 3D model. The first 2D matrix calculated here represents the amount of deviation between the manufactured object 180 and a nominal 3D CAD model used as the input to the manufacturing machine 170.

An upper and lower bound for the difference value (i.e., the difference value for each entry in the 2D matrix obtained in 302) is defined 304, e.g., by the CAM program(s) 116, based on the amount of deviations that can happen in a manufacturing process. The upper and lower bound is later used in the quantization process to produce 306 a quantized matrix. For example, in aerofoil manufacturing through casting, the range for deviations can be [−5, 5] mm. Therefore, the upper and lower bound for the difference value is −5 mm and 5 mm respectively. The upper and lower bound can either be defined 304 before obtaining 302 a first 2D matrix or after obtaining 302 a first 2D matrix as shown.

A second 2D matrix is produced 306, e.g., by the CAM programs(s) 116, by a 16-bit quantization process that replaces each real number X in the second 2D matrix with an approximation $X_q$ from a finite set of discrete values. In digital image processing techniques, images can be represented using various bit depths, e.g., by 8-bits per channel (providing 256 possible values), 16-bits per channel (providing 65,536 possible values), 24-bits per channel (providing 16,777,216 possible values), etc. In addition, the image representations can use color or grayscale channels. The 8-bit bit depth is often sufficient to present natural images. However, in many manufactured objects, the defect tolerance is extremely low. In quantization step 306, 16-bit bit depth is chosen instead of 8-bit bit depth such that a low tolerance is possible.

For example, by using a 16-bit unsigned integer quantization process, the lower bound defined in 304 corresponds to 0 after quantization and the upper bound defined in 304 corresponds to 65,535 after quantization. Any defects that result in deviations smaller than the quantization step is approximated by 0 and ignored. In this example, defect tolerance within 0.01 mm can be achieved. On the other hand, 8-bit bit depth representation only provides 256 grayscale levels. For a deviation range of [−5, 5] mm, 8-bit grayscale representation will generate a stepped mesh (10 mm/256=0.039 mm) and therefore cannot achieve tolerance within 0.01 mm. Thus, the image representation format should be selected at least in part based on how precise the defect detection and removal process should be for the application at hand.

A 2D grayscale image with 16-bit bit depth is saved 308, e.g., by the CAM program(s) 116, using the second 2D matrix produced in 306. Image-to-image translation based machine learning algorithms can be used with both color and grayscale images. The systems and techniques described can be used with both color and grayscale images. Using grayscale images with higher bit depth has the advantage of representing deviations in a manufactured object with very low tolerance. However, implementations that use image formats with color channels of 8-bit, 16-bit, 24-bit, etc. bit depth are also possible. For example, 16-bit color channel images (e.g., RGB images) can be used, where one of the color channels is used to encode the distance deviations, and potentially, one or more remaining color channels can be used to encode other information, such as the curvature of the surface. In the present example, the second 3D matrix is saved as a 2D grayscale image with 16-bit bit depth. This 2D grayscale image is further provided 206 to the machine learning algorithm in FIG. 2A. Similarly, the second 2D image received 208 in FIG. 2A is also a 2D grayscale image with 16-bit bit depth in order to allow low tolerance in the manufactured object.

Figure 4:
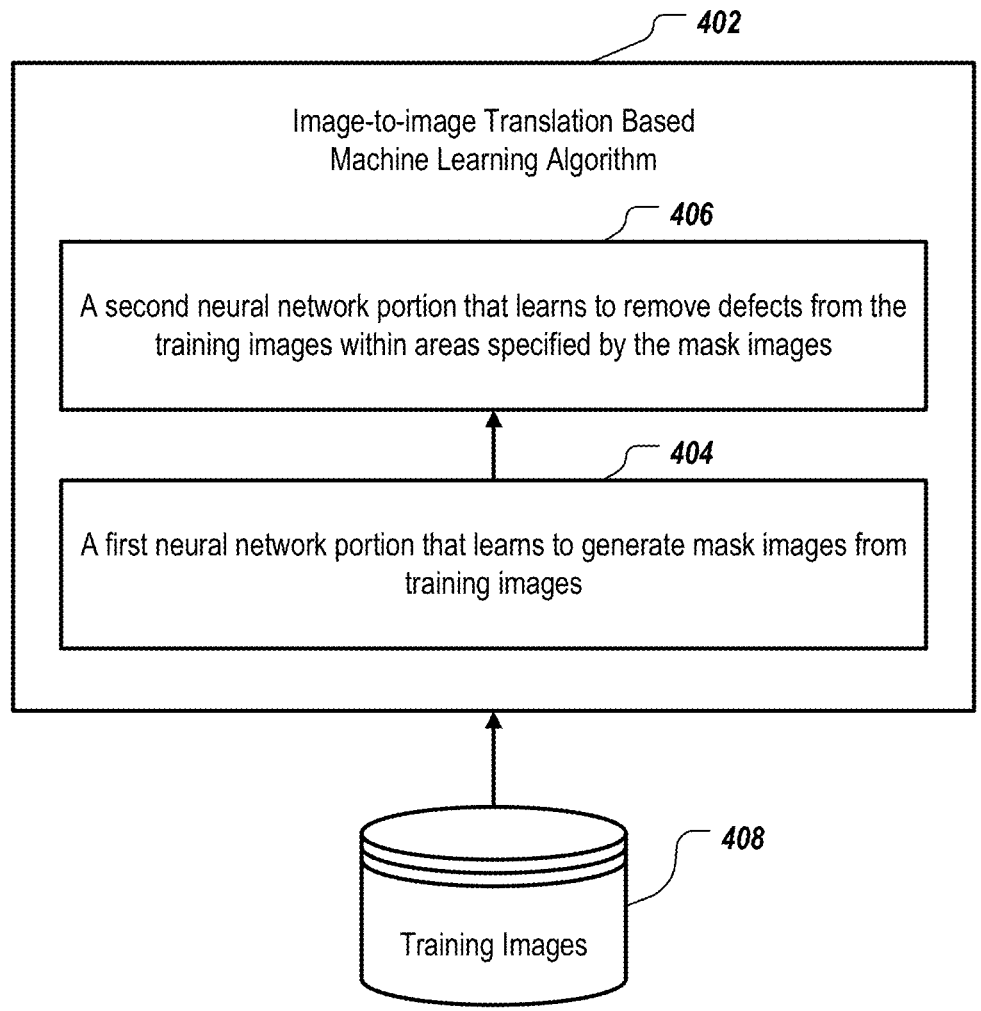
FIG. 4 is a combined schematic diagram and flowchart showing an example of an image-to-image translation based machine learning algorithm.

FIG. 4 shows an example of the image-to-image translation based machine learning algorithm. The image-to-image translation based machine learning algorithm 402 employs (a) a first neural network portion 404 that learns to generate mask images from training images 408 and (b) a second neural network portion 406 that learns to remove defects from the training images 408 within areas specified by the mask images. The machine learning algorithm can either work with neural network architectures, or without neural network architectures.

For example, a first algorithm can be trained to generate 2D masks around the defected area in the input 2D image. Using these masks, a second algorithm can perform inpainting to the input 2D image and generate an output 2D image that is the same as the input image except that the defect areas are corrected. In some implementations, the image-to-image translation based machine learning algorithm 402 employs a single neural network, instead of two neural networks as shown in FIG. 4. The single neural network learns to remove defects from the training images and generates a translated image without defects, without relying on any intermediate step of generating mask and/or bounding-box images for the areas with defects.

Figure 5:
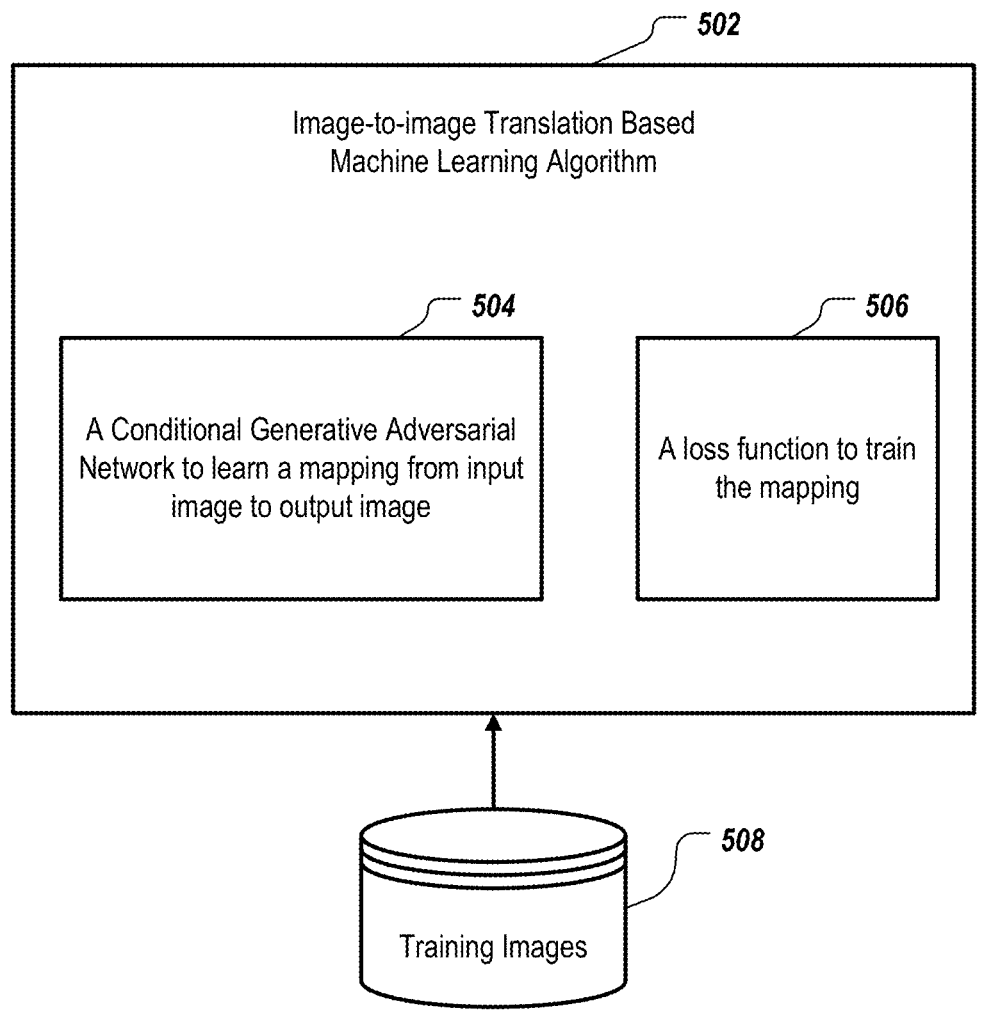
FIG. 5 is a schematic diagram showing an example of an image-to-image translation based machine learning algorithm that employs a Conditional Generative Adversarial Network.

FIG. 5 shows another example of the image-to-image translation based machine learning algorithm. The image-to-image translation based machine learning algorithm 502 employs (a) a Conditional Generative Adversarial Network (CGAN) 504 to learn a mapping from an input image to an output image and (b) a loss function 506 to training the mapping.

In the Conditional GAN 504, a generator learns to generate an image sample with a specific condition or characteristic rather than a generic image sample from unknown noise distribution. The specific condition or characteristics in the example of 504 requires that the output translated image is exactly the same as the input image, except for regions with defects that are to be removed. This condition or characteristic is formulated in the loss function 506 that calculates both the generator loss and discriminator loss using the generated image sample and the pair of training input images 508.

For example, the image-to-image translation algorithm can be pixel2pixel GAN implemented in Tensorflow. The pixel2pixel GAN applies Conditional Generative Adversarial Networks as a general purpose solution to image-to-image translation problems. The pixel2pixel GAN not only learns the mapping from the input image to output image, but also learn a loss function adapted to the task and training data. The pixel2pixel GAN may use a generator architecture such as a U-Net that has skip connections. The pixel2pixel GAN may use a discriminator such as PatchGAN that only penalizes structure at the scale of patches. In some implementations, the loss function 506 is a L1 loss, or a L2 loss or a combination of L1 and L2 loss.

The implementation of an image-to-image translation based machine learning algorithm is not limited to the techniques described in connection with FIG. 4 and FIG. 5. Other machine learning models such as pix2pix HD model, Gaussian Mixture GAN model, or variations of these models can also be applied to the systems and techniques of the present disclosure.

A generator in the Conditional GAN 504 includes a series of convolution layers followed by a series of deconvolution layers. Each convolution layer performs down sampling operations to an input image and obtains a high dimensional abstract feature representation of the input image. Each deconvolution layers performs up sampling operations to a feature representation and obtains a desired output image.

Due to the up sampling operations in the deconvolution layers, high frequency noise patterns (e.g., checkerboard artifacts) are sometimes observed in the output 2D images both on the deformed area and on the defected area. In some implementations, the Conditional GAN 504 in FIG. 5 can be modified to remove and/or reduce the undesired high frequency noise in the translated images.

Figure 6:
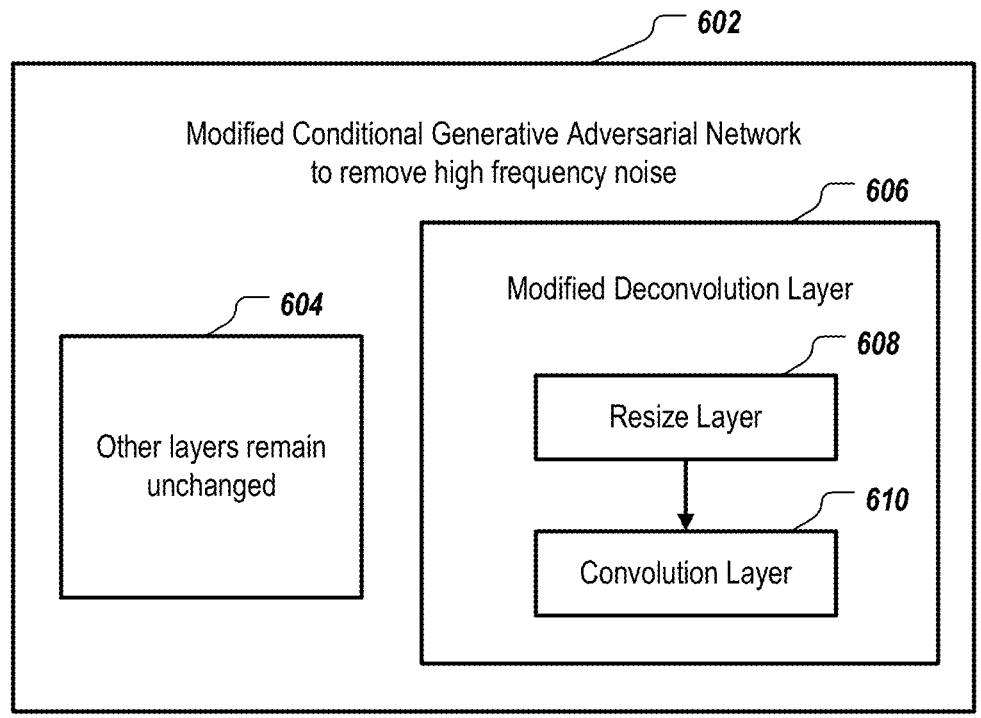
FIG. 6 is an example of a modified Conditional Generative Adversarial Network to remove high frequency noise in the output image.

FIG. 6 shows a modified Conditional GAN 602 with one or more modified deconvolution layers 606, while other layers 604 remain unchanged. A deconvolution layer can be implemented as a transposed convolution operator, which may produce high frequency noise patterns in the translated images. The modified deconvolution layer 606 includes a resize layer 608, followed by a convolution layer 610. The resize layer 608 up samples the input data to the modified deconvolution layer using resize operators. Useable resize operators include nearest-neighbor interpolation or bilinear interpolation. The convolution layer 610 takes the output of the resize layer 608 as input, and performs convolution operations. The modified deconvolution layer 606 can effectively perform up sampling operation and significantly reduce or remove the high frequency noise in the output image.

For example, the modified deconvolution layer 606 can include: (1) a resize layer of an up sampling rate of 2 by 2 with nearest neighbor interpolation; and (2) a separable 2D convolution layer with kernel size 4. As another example, the modified deconvolution layer 606 can include: (1) a resize layer of an up sampling rate of 2 by 2 with nearest neighbor interpolation; and (2) a non-separable 2D convolution layer with kernel size 4. Using a separable convolution layer has the advantage of less parameters to learn and faster inference speed, while sacrificing the accuracy in some applications. A non-separable convolution layer can produce more accurate results with an order of more parameters, while requiring more training data and slower inference speed.

Figure 7:
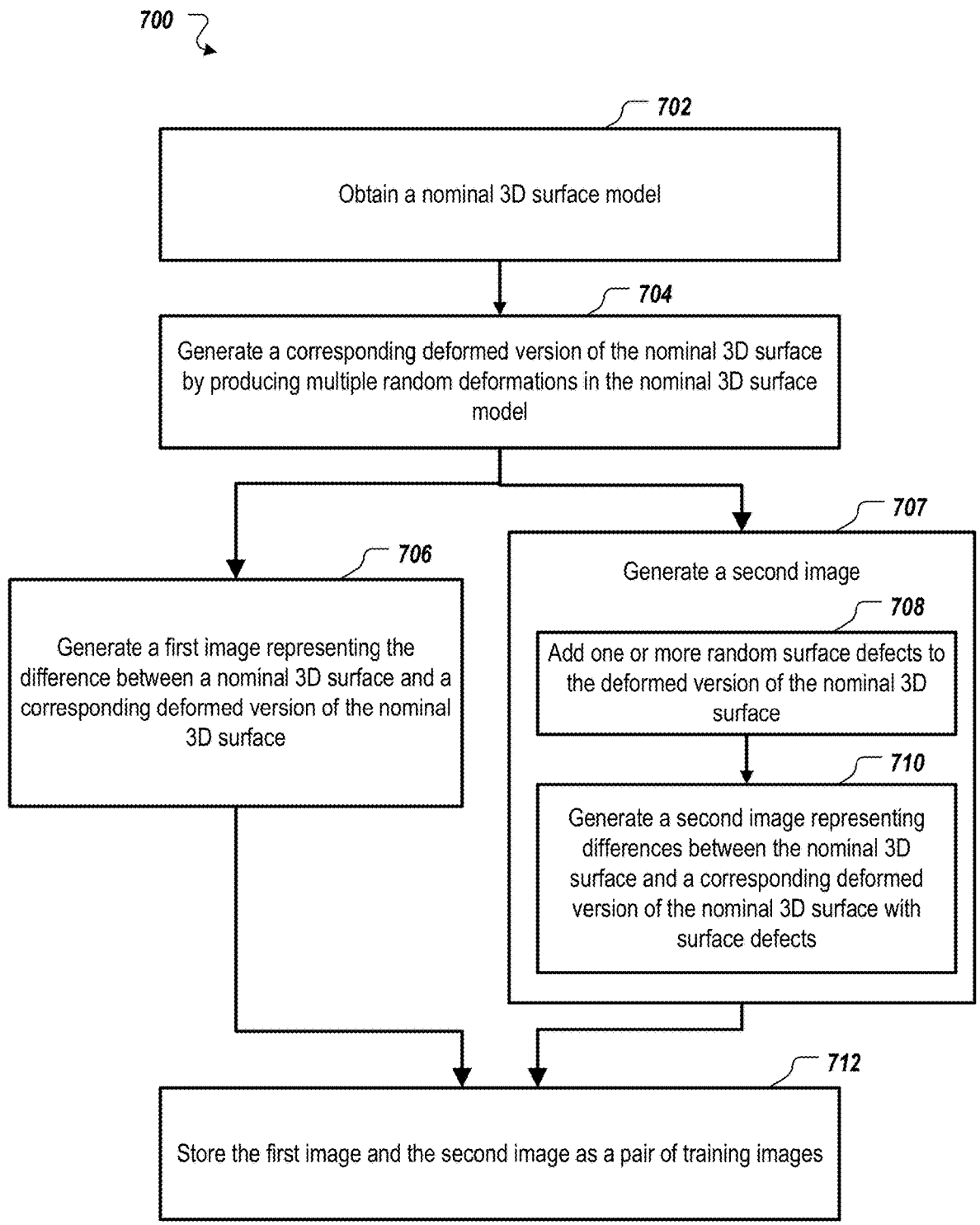
FIG. 7 is a flowchart showing an example of generating a pair of training images from a nominal three-dimensional surface.

FIG. 7 shows an example of generating a pair of training images from a nominal three-dimensional surface (e.g., an example of generating pairs of input images 222 in FIG. 2A). A nominal 3D surface model is obtained 702, e.g., by CAM program(s) 116. A corresponding deformed version of the nominal 3D surface is generated 704, e.g., by CAM program(s) 116, by producing one or more random deformations in the nominal 3D surface model. The random deformations represents typical deformations seen in the manufacturing process, e.g., with manufacturing machine 170.

Next, a pair of input images are generated. A first image is generated 706, e.g., by CAM program(s) 116, representing the difference between a nominal 3D surface in 702 and a corresponding deformed version of the nominal 3D surface in 704. A second image is generated 707, e.g., by CAM program(s), including operations 708 and 710. One or more random surface defects are added 708, e.g., by CAM program(s), to the deformed version of the nominal 3D surface. The random surface defects represent typical defects seen in the manufacturing process, e.g., with manufacturing machine 170. In some implementations, the random surface defects have an upper bound and a lower bound which limit the size of the defects.

A second image is generated 710, e.g., by CAM program(s), representing the difference between the nominal 3D surface and a corresponding deformed version of the nominal 3D surface with the random surface defects. Generating the first image 706 and generating the second image 707 can be performed in parallel as shown in FIG. 7, or sequentially.

For example, a synthetic dataset of 5000 training images can be generated to include defects that are similar to the defects in manufactured objects from manufacturing turbine blades for an engine (e.g., for an airplane or a wind turbine) through casting. Without using real measured mesh data, these training images are generated by adding filters on a bent plane, which can sufficiently represent the 2D images that can be obtained by mapping 3D surface models to 2D images. The machine learning algorithm trained with these training images can be transferred on to similar real images in turbine blade manufacturing.

The first and second images are stored 712, e.g., by CAM program(s) 116, as a pair of training images later to be used to train an image-to-image translation based machine learning algorithm. The operations 700 are repeatedly applied to one or more nominal 3D surface models, resulting in many pairs of training images. The pairs of training images can be stored locally, e.g., on the memory 114 of computer 110, remotely, e.g., on a computer of one or more remote computer systems 150 (e.g., one or more computer systems with large memory) or both locally and remotely. The operations 700 can likewise be performed locally, remotely, or both locally and remotely.

Figure 8:
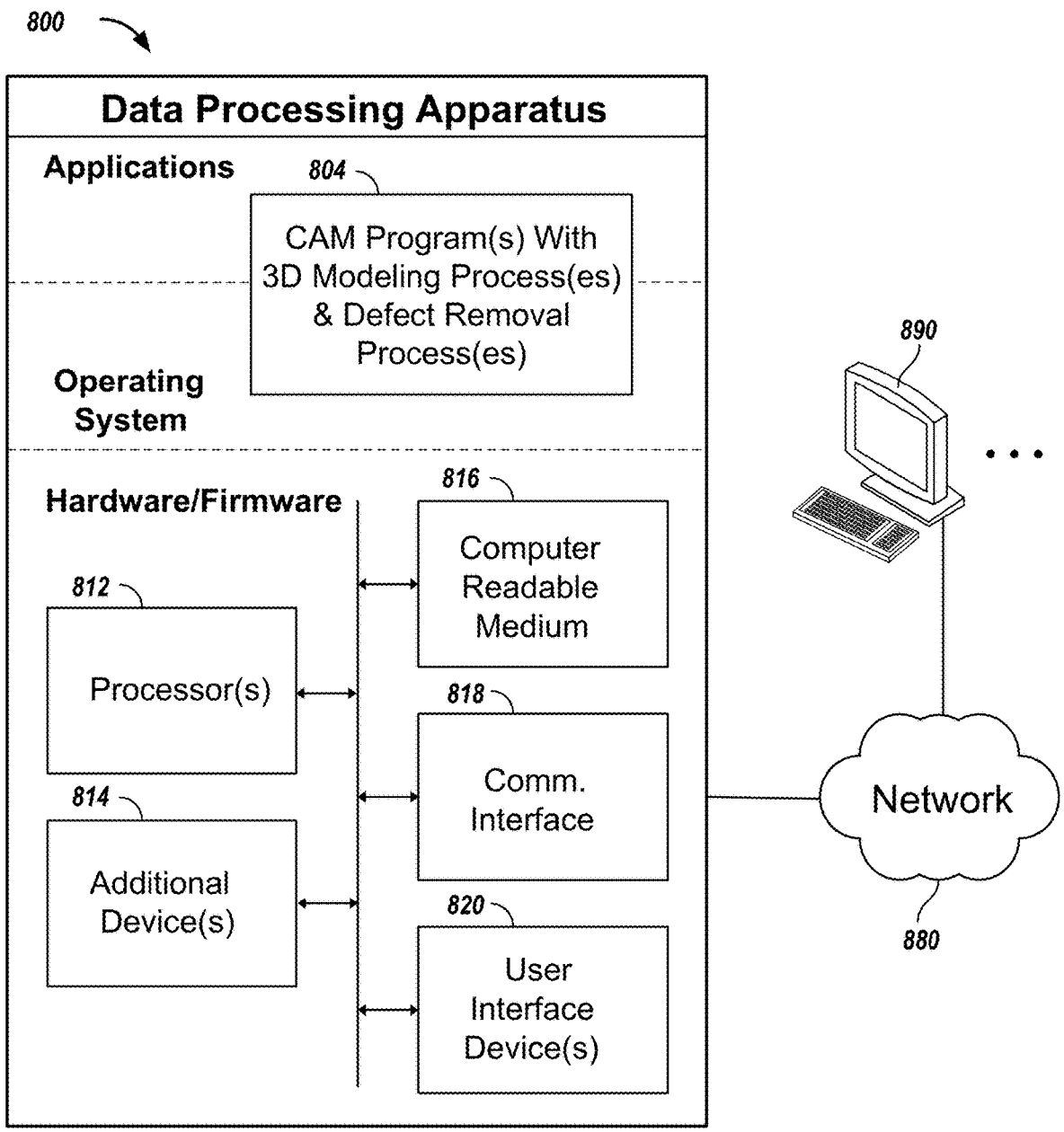
FIG. 8 is a schematic diagram of a data processing system including a data processing apparatus, which can be programmed as a client or as a server.

FIG. 8 is a schematic diagram of a data processing system including a data processing apparatus 800, which can be programmed as a client or as a server. The data processing apparatus 800 is connected with one or more computers 890 through a network 880. While only one computer is shown in FIG. 8 as the data processing apparatus 800, multiple computers can be used. The data processing apparatus 800 includes various software modules, which can be distributed between an applications layer and an operating system. These can include executable and/or interpretable software programs or libraries, including tools and services of one or more 3D modeling and defect removal programs 804 that implement the systems and techniques described herein. Thus, the 3D modeling and defect removal program(s) 804 can be adaptive repair, adjusting machining, and/or CAM program(s) 804 that implement 3D modeling and defect removal functions and produce a 3D model of a morphed 3D surface with the defects removed.

The number of software modules used in 800 can vary from one implementation to another. Moreover, the software modules can be distributed on one or more data processing apparatus connected by one or more computer networks or other suitable communication networks.

The data processing apparatus 800 also includes hardware or firmware devices including one or more processors 812, one or more additional devices 814, a computer readable medium 816, a communication interface 818, and one or more user interface devices 820. Each processor 812 is capable of processing instructions for execution within the data processing apparatus 800. In some implementations, the processor 812 is a single or multi-threaded processor, with or without GPUs. Each processor 812 is capable of processing instructions stored on the computer readable medium 816 or on a storage device such as one of the additional devices 814. The data processing apparatus 800 uses the communication interface 818 to communicate with one or more computers 890, for example, over the network 880. Examples of user interface devices 820 include a display, a camera, a speaker, a microphone, a tactile feedback device, a keyboard, a mouse, and VR and/or AR equipment.

The data processing apparatus 800 can store instructions that implement operations associated with the program(s) described above, for example, on the computer readable medium 816 or one or more additional devices 814, for example, one or more of a hard disk device, an optical disk device, a tape device, and a solid state memory device.

The systems and techniques described in this disclosure can provide an automatic solution for adaptive repair that can be employed by users without sophisticated knowledge of a particular manufacturing process and manufactured parts. Therefore, the systems and techniques described in this disclosure may be a more economical and efficient solution to the surface defect removal problems in computer aided manufacturing.

The systems and techniques described in this disclosure can remove either positive defects or negative defects, or combination of both kinds of defects. The systems and techniques described in this disclosure can be used to suggest how much material to add, and where to add such material, to compensate for negative defects. The techniques can be applied as a post processing step during manufacturing parts and objects before the manufactured parts are shipped and used outside the factory. Alternatively or additionally, the systems and techniques can be used during repair for parts that have been used outside the factory. The manufactured parts that need repair after they have been used for a while can be processed using the systems and techniques described to remove the defects.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented using one or more modules of computer program instructions encoded on a non-transitory computer-readable medium for execution by, or to control the operation of, data processing apparatus. The computer-readable medium can be a manufactured product, such as hard drive in a computer system or an optical disc sold through retail channels, or an embedded system. The computer-readable medium can be acquired separately and later encoded with the one or more modules of computer program instructions, e.g., after delivery of the one or more modules of computer program instructions over a wired or wireless network. The computer-readable medium can be a machine-readable storage device, a machine-readable storage substrate, a memory device, or a combination of one or more of them.

The term "data processing apparatus" encompasses all apparatus, devices, and machines for processing data, including by way of example a programmable processor, a computer, or multiple processors or computers. The apparatus can include, in addition to hardware, code that produces an execution environment for the computer program in question, e.g., code that constitutes processor firmware, a protocol stack, a database management system, an operating system, a runtime environment, or a combination of one or more of them. In addition, the apparatus can employ various different computing model infrastructures, such as web services, distributed computing and grid computing infrastructures.

A computer program (also known as a program, software, software application, script, or code) can be written in any suitable form of programming language, including compiled or interpreted languages, declarative or procedural languages, and it can be deployed in any suitable form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM (Erasable Programmable Read-Only Memory), EEPROM (Electrically Erasable Programmable Read-Only Memory), and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., an LCD (liquid crystal display) display device, an OLED (organic light emitting diode) display device, or another monitor, for displaying information to the user, and a keyboard and a pointing device, e.g., a mouse or a trackball, by which the user can provide input to the computer. Other kinds of devices can be used to provide for interaction with a user as well; for example, feedback provided to the user can be any suitable form of sensory feedback, e.g., visual feedback, auditory feedback, or tactile feedback; and input from the user can be received in any suitable form, including acoustic, speech, or tactile input.

The computing system can include clients and servers. A client and server are generally remote from each other and typically interact through a communication network. The relationship of client and server arises by virtue of computer programs running on the respective computers and having a client-server relationship to each other. Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a browser user interface through which a user can interact with an implementation of the subject matter described is this specification, or any combination of one or more such back-end, middleware, or front-end components. The components of the system can be interconnected by any suitable form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While this specification contains many implementation details, these should not be construed as limitations on the scope of what is being or may be claimed, but rather as descriptions of features specific to particular embodiments of the disclosed subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the invention have been described. Other embodiments are within the scope of the following claims. In addition, actions recited in the claims can be performed in a different order and still achieve desirable results.

What is claimed is:

1. A method comprising:
    obtaining, in a computer aided manufacturing program,
        a first three dimensional model of at least one actual three dimensional surface of a manufactured object, and
        a second three dimensional model of at least one source three dimensional surface used as input to a manufacturing process that generated the manufactured object;
    producing, by the computer aided manufacturing program, a two dimensional image by projection of points between the first three dimensional model and the second three dimensional model, wherein each of multiple pixel values in the two dimensional image is a difference along a projection from a point in the second three dimensional model to a corresponding point in the first three dimensional model;
    providing, by the computer aided manufacturing program, the two dimensional image to an image-to-image translation based machine learning algorithm, wherein the image-to-image translation based machine learning algorithm was previously trained using pairs of input images, each of the pairs of input images being
        a first image representing differences between a nominal three dimensional surface and a corresponding morphed version of the nominal three dimensional surface, and
        a second image representing differences between the nominal three dimensional surface and a corresponding morphed version of the nominal three dimensional surface with one or more included surface defects;
    receiving, by the computer aided manufacturing program, a translated version of the two dimensional image from the image-to-image translation based machine learning algorithm; and
    producing, by the computer aided manufacturing program, a third three dimensional model of at least one morphed three dimensional surface corresponding to the at least one source three dimensional surface by projection of points between the first three dimensional model and the second three dimensional model using differences represented by pixel values in the translated version of the two dimensional image;
    wherein the manufacturing process that generated the manufactured object comprises casting, and the method further comprises removing at least one casting defect from the manufactured object by milling the manufactured object in accordance with the third three dimensional model of the at least one morphed three dimensional surface.

2. The method of claim 1,
    wherein the image-to-image translation based machine learning algorithm employs (a) at least a first neural network portion that learns to generate mask images from training images, and (b) at least a second neural network portion that learns to remove defects from the training images within areas specified by the mask images, and wherein the at least one morphed three dimensional surface of the third three dimensional model includes deformation or warping of the manufactured object as represented in the at least one actual three dimensional surface of the first three dimensional model and also removes at least one surface defect of the manufactured object as represented in the at least one actual three dimensional surface of the first three dimensional model.

3. The method of claim 1, further comprising training the image-to-image translation based machine learning algorithm.

4. The method of claim 3, wherein training the image-to-image translation based machine learning algorithm comprises:

generating the pairs of input images by automatically producing multiple random deformations in, and adding multiple random surface defects to, at least one three dimensional surface model; and providing the pairs of input images to the image-to-image translation based machine learning algorithm to process.

5. The method of claim 4, wherein the image-to-image translation based machine learning algorithm employs (a) Conditional Generative Adversarial Networks to learn a mapping from input image to output image and (b) a loss function to train the mapping.

6. The method of claim 5, wherein the Conditional Generative Adversarial Networks are modified to remove high frequency noise in the output image, wherein the modified Conditional Generative Adversarial Networks comprise:

one or more of deconvolution layers comprising:
a resize layer which resizes input data to a modified devolution layer; and
a convolution layer which takes an output of the resize layer as input, and performs convolution operations.

7. A method comprising:

obtaining, in a computer aided manufacturing program,
a first three dimensional model of at least one actual three dimensional surface of a manufactured object, and
a second three dimensional model of at least one source three dimensional surface used as input to a manufacturing process that generated the manufactured object;

producing, by the computer aided manufacturing program, a two dimensional image by projection of points between the first three dimensional model and the second three dimensional model, wherein each of multiple pixel values in the two dimensional image is a difference along a projection from a point in the second three dimensional model to a corresponding point in the first three dimensional model;

providing, by the computer aided manufacturing program, the two dimensional image to an image-to-image translation based machine learning algorithm, wherein the image-to-image translation based machine learning algorithm was previously trained using pairs of input images, each of the pairs of input images being a first image representing differences between a nominal three dimensional surface and a corresponding morphed version of the nominal three dimensional surface, and a second image representing differences between the nominal three dimensional surface and a corresponding morphed version of the nominal three dimensional surface with one or more included surface defects;

receiving, by the computer aided manufacturing program, a translated version of the two dimensional image from the image-to-image translation based machine learning algorithm; and producing, by the computer aided manufacturing program, a third three dimensional model of at least one morphed three dimensional surface corresponding to the at least one source three dimensional surface by projection of points between the first three dimensional model and the second three dimensional model using differences represented by pixel values in the translated version of the two dimensional image;

wherein the manufacturing process that generated the manufactured object comprises additive manufacturing, and the method further comprises removing at least one support structure remnant from the manufactured object by milling the manufactured object in accordance with the third three dimensional model of the at least one morphed three dimensional surface.

8. The method of claim 7, wherein the image-to-image translation based machine learning algorithm employs (a) at least a first neural network portion that learns to generate mask images from training images, and (b) at least a second neural network portion that learns to remove defects from the training images within areas specified by the mask images.

9. The method of claim 7, further comprising training the image-to-image translation based machine learning algorithm.

10. The method of claim 9, wherein training the image-to-image translation based machine learning algorithm comprises:

generating the pairs of input images by automatically producing multiple random deformations in, and adding multiple random surface defects to, at least one three dimensional surface model; and providing the pairs of input images to the image-to-image translation based machine learning algorithm to process.

11. The method of claim 10, wherein the image-to-image translation based machine learning algorithm employs (a) Conditional Generative Adversarial Networks to learn a mapping from input image to output image and (b) a loss function to train the mapping.

12. The method of claim 11, wherein the Conditional Generative Adversarial Networks are modified to remove high frequency noise in the output image, wherein the modified Conditional Generative Adversarial Networks comprise:

one or more of deconvolution layers comprising:
a resize layer which resizes input data to a modified devolution layer; and
a convolution layer which takes an output of the resize layer as input, and performs convolution operations.

13. A system comprising:

a non-transitory storage medium having instructions of a computer aided manufacturing program stored thereon; and one or more data processing apparatus able to run the instructions of the computer aided manufacturing program to perform operations specified by the instructions of the computer aided manufacturing program;

wherein the instructions of the computer aided manufacturing program comprise means for generating a two dimensional difference image from a first three dimensional model of at least one actual three dimensional surface of a manufactured object, and a second three dimensional model of at least one source three dimensional surface used as input to a manufacturing process that generated the manufactured object, means for obtaining from an image-to-image translation based machine learning algorithm, trained using pairs of input images representing deformed and deformed plus surface defected added versions of a nominal three dimensional surface, a translated version of the two dimensional difference image, and means for generating, from the translated version of the two dimensional difference image, a third three dimensional model of at least one morphed three dimensional surface corresponding to the at least one source three dimensional surface;

wherein the manufacturing process that generated the manufactured object comprises additive manufacturing, and a manufacturing machine of the system is configured to remove at least one support structure remnant from the manufactured object by milling the manufactured object in accordance with the third three dimensional model of the at least one morphed three dimensional surface.

14. The system of claim 13, wherein the means for obtaining comprises means for employing (a) at least a first neural network portion that learns to generate mask images from training images, and (b) at least a second neural network portion that learns to remove defects from the training images within areas specified by the mask images.

15. The system of claim 13, wherein the means for obtaining comprises means for training the image-to-image translation based machine learning algorithm using image pairs that are generated by automatically producing multiple random deformations in, and adding multiple random surface defects to, at least one three dimensional surface model.

16. The system of claim 15, wherein the means for obtaining comprises means for employing (a) Conditional Generative Adversarial Networks to learn a mapping from input image to output image and (b) a loss function to train the mapping.

17. The system of claim 16, wherein the Conditional Generative Adversarial Networks are modified to remove high frequency noise in the output image, wherein the modified Conditional Generative Adversarial Networks comprise:

one or more of deconvolution layers comprising:
a resize layer which resizes input data to a modified devolution layer; and
a convolution layer which takes an output of the resize layer as input, and performs convolution operations.

18. A system comprising:
a non-transitory storage medium having instructions of a computer aided manufacturing program stored thereon; and
one or more data processing apparatus able to run the instructions of the computer aided manufacturing program to perform operations specified by the instructions of the computer aided manufacturing program;

wherein the instructions of the computer aided manufacturing program comprise means for generating a two dimensional difference image from a first three dimensional model of at least one actual three dimensional surface of a manufactured object, and a second three dimensional model of at least one source three dimensional surface used as input to a manufacturing process that generated the manufactured object, means for obtaining from an image-to-image translation based machine learning algorithm, trained using pairs of input images representing deformed and deformed plus surface defected added versions of a nominal three dimensional surface, a translated version of the two dimensional difference image, and means for generating, from the translated version of the two dimensional difference image, a third three dimensional model of at least one morphed three dimensional surface corresponding to the at least one source three dimensional surface;

wherein the manufacturing process that generated the manufactured object comprises casting, and a manufacturing machine of the system is configured to remove at least one casting defect from the manufactured object by milling the manufactured object in accordance with the third three dimensional model of the at least one morphed three dimensional surface.

19. The system of claim 18, wherein the means for obtaining comprises means for employing (a) at least a first neural network portion that learns to generate mask images from training images, and (b) at least a second neural network portion that learns to remove defects from the training images within areas specified by the mask images, and wherein the at least one morphed three dimensional surface of the third three dimensional model includes deformation or warping of the manufactured object as represented in the at least one actual three dimensional surface of the first three dimensional model and also removes at least one surface defect of the manufactured object as represented in the at least one actual three dimensional surface of the first three dimensional model.

20. The system of claim 18, wherein the means for obtaining comprises means for training the image-to-image translation based machine learning algorithm using image pairs that are generated by automatically producing multiple random deformations in, and adding multiple random surface defects to, at least one three dimensional surface model.

21. The system of claim 20, wherein the means for obtaining comprises means for employing (a) Conditional Generative Adversarial Networks to learn a mapping from input image to output image and (b) a loss function to train the mapping.

22. The system of claim 21, wherein the Conditional Generative Adversarial Networks are modified to remove high frequency noise in the output image, wherein the modified Conditional Generative Adversarial Networks comprise:

one or more of deconvolution layers comprising:
a resize layer which resizes input data to a modified devolution layer; and
a convolution layer which takes an output of the resize layer as input, and performs convolution operations.

* * * * *